United States Patent [19]

Opower

[11] Patent Number: 5,492,861

[45] Date of Patent: Feb. 20, 1996

[54] PROCESS FOR APPLYING STRUCTURED LAYERS USING LASER TRANSFER

[75] Inventor: Hans Opower, Krailling, Germany

[73] Assignee: Deutsche Forschungsanstalt fuer Luft-und Raumfahrt e.V., Bonn, Germany

[21] Appl. No.: 112,711

[22] Filed: Aug. 26, 1993

[30] Foreign Application Priority Data

Sep. 3, 1992 [DE] Germany ............................ 42 29 398.7
Sep. 26, 1992 [DE] Germany ............................ 42 32 373.8

[51] Int. Cl.$^6$ ........................ H01L 21/268; C23C 14/14
[52] U.S. Cl. .................... 437/173; 427/597; 148/DIG. 93
[58] Field of Search ................................ 427/597, 561; 437/173; 148/DIG. 90, DIG. 93; 204/192.1, 192.12, 192.11, 298.02, 298.01, 298.04

[56] References Cited

U.S. PATENT DOCUMENTS

| T988,007 | 11/1979 | Drew et al. .............................. 427/597 |
| 3,560,258 | 2/1971 | Brisbane . |
| 4,714,628 | 12/1987 | Eloy . |

(List continued on next page.)

FOREIGN PATENT DOCUMENTS

| 0002738 | 7/1979 | European Pat. Off. . |
| 2113336 | 9/1971 | Germany . |
| 2523982 | 5/1975 | Germany . |
| 1118429 | 10/1984 | U.S.S.R. . |

OTHER PUBLICATIONS

W. Marine, et al., Laser Ablation of Electronic Materials p. 89, Elsevier Publishing–EMRS Monographs vol. 4, 1992.
R. J. von Gutfeld, et al., Appl. Phys. Lett., 35(9) 1979 "Laser Enhanced Electroplating and Maskless . . .".
R. T. Hodgson, et al., IBM Tech. Discl. Bulletin, vol. 21, #10, 1979, "Ohmic Contacts Made by Lasers".
J. P. Coullahan et al., IBM, Tech. Discl. Bulletin, vol. 22, #6, 1979 "Chip Passivation Technique".
J. Bohandy, et al., "Metal deposition at 532 nm using a laser technique," *J. Appl. Phys.* vol. 63(4), Feb. 15, 1988, pp. 1158–1162.
J. Bohandy, et al., "Metal deposition from a supported metal film using an excimer laser," *J. Appl. Phys.* vol. 60(4), Aug. 15, 1986, pp. 1538–1539.
F. J. Adrian, et al., "A study of the mechanism of metal deposition by the laser–induced forward transfer process" *J. Vac. Sci. Technol. B*, vol. 5, No. 5, Sep./Oct 1987, pp. 1490–1494.
V. Schultze et al., "Laser–induced forward transfer of aluminum," *Applied Surface Science* vol. 52 (1991), pp. 303–309.
R. J. Baseman, et al., "Laser induced forward transfer," *Symp. Mat. Res. Soc.* 1988, pp. 237–242 Laser and Particle Beam, Chemical Processing for Microelectronics.
P. Matossi, *Lehrbuch der Experimentalphysik*, "Band III, Optik,"Walter de Gruyter & Co., Berlin 1966, pp. 108–113.
E. Fogarassy, et al., "Laser–induced forward transfer of high–$T_c$ YBsaCuO and BiSrCaCuO superconducting thin films," *Journal of Applied Physics* vol. 66(1), Jul. 1, 1989, pp. 457–459.

*Primary Examiner*—Brian E. Hearn
*Assistant Examiner*—Leon Radomsky
*Attorney, Agent, or Firm*—Barry R. Lipsitz

[57] ABSTRACT

In order to provide a process for applying structured layers of a functional structure of a semiconductor component, with which structured layers of a functional structure of a semiconductor component can be produced as simply as possible and with as little susceptibility as possible with respect to the quality of the semiconductor components, it is suggested that a material film be arranged above a surface region of a process substrate to be provided with the structured layer, that the material film be acted upon on its side remote from the process substrate by a focus of a laser beam located in a defined position corresponding to the structured layer to be produced and that with the laser beam in the region of the focus the material from the material film migrate to the surface region.

44 Claims, 5 Drawing Sheets

U.S. PATENT DOCUMENTS

| | | |
|---|---|---|
| 4,743,463 | 5/1988 | Ronn et al. . |
| 4,752,455 | 6/1988 | Mayer . |
| 4,895,735 | 1/1990 | Cook . |
| 4,970,196 | 11/1990 | Kim et al. . |
| 4,987,006 | 1/1991 | Williams et al. . |
| 5,065,697 | 11/1991 | Yoshida . |
| 5,173,441 | 12/1992 | Yu et al. . |
| 5,231,047 | 7/1993 | Ovshinsky et al. ............... 437/173 |
| 5,292,559 | 4/1994 | Joyce et al. ............... 427/597 |

PROCESS FOR APPLYING STRUCTURED LAYERS USING LASER TRANSFER

The invention relates to a process for applying structured layers of a functional structure of a semiconductor component.

In accordance with the customary technology of today, a plurality of process steps are performed for the production of semiconductor components. These steps are carried out partially under vacuum conditions and partially under normal atmospheric pressure and chemical substances and foreign materials are used in them.

For example, structured layers are produced by multiple structuring and doping of layers using photolithography, whereby the photolithography comprises application of a photoresist layer, exposure, development and etching of a substrate.

Furthermore, metallizations of a substrate are produced, for example, by chemical deposition of metal layers.

The known technology is extremely susceptible with respect to the resulting quality of semiconductor components since the substrate comes into contact with a plurality of foreign substances. This means that the possibilities of soiling are numerous and, in the end, these impair the quality of the semiconductor components.

The object underlying the invention is therefore to provide a process for applying structured layers of a semiconductor component, with which structured layers of a functional structure of a semiconductor component can be produced as simply as possible and with as little susceptibility as possible with respect to the quality of the semiconductor components.

This object is accomplished in accordance with the invention, in a process of the type described at the outset, in that a material film is arranged above a surface region of a process substrate to be provided with the structured layer, that the material film is acted upon on its side remote from the process substrate by a focus of a laser beam located in a defined position corresponding to the structured layer to be produced and that the material in the material film is heated with the laser beam in the region of the focus and material from the material film thereby migrates from the focus region to the surface region.

The advantage of the inventive process is to be seen in the fact that with this process it is possible to apply material from the material film to exactly defined locations of the surface region of the process substrate, whereby the individual locations can be predetermined in a simple manner by the defined positioning of the focus.

The material film can be made available in the most varied of manners. For example, in a particularly advantageous embodiment the material film is formed by a self-supporting foil, the material of which is then applied to the surface region of the process substrate.

In this case, it is particularly advantageous for a plasma to be generated on the rear side of the foil by means of the laser beam, this plasma accelerating foil material on the front side of the foil onto the process substrate. While the plasma is being generated, in particular, a pressure surge is generated in the foil which acts through the entire foil and on the front side of the foil leads to the acceleration of the foil material in the direction towards the process substrate.

Alternatively to the provision of the material film in the form of the self-supporting foil, in an additional advantageous embodiment of the inventive solution the material film is arranged on a carrier permeable to the laser beam. This embodiment offers the great advantage that the material film itself no longer needs to have any inherent stability, as with the foil, but that the inherent or natural stability with respect to the exact positioning can be achieved due to the carrier permeable to the laser beam and so the material film can be selected to be considerably thinner.

The carrier can, for example, be a transparent foil, on which the material film is arranged. It is, however, even more advantageous for the carrier to be a transparent element rigid in its form since this element is easier to position and to move, and with it the material film, due to its inherent form rigidity.

In the case where a material film arranged on a carrier is used, a particularly preferred embodiment of the inventive solution provides for a plasma penetrating a thickness of the material film to be generated with the laser beam. This means that a different process is selected for the acceleration of particles from the material film in the direction towards the process substrate. In this process, the plasma expands out of the focus region in the direction of the process substrate, preferably in a cone at right angles to a surface of the material film facing the process substrate. Material from the material film is, therefore, preferably applied in a region of the process substrate located opposite the focus region.

In this embodiment, the material film preferably has a thickness of less than 100 nm. In this respect, a thickness of approximately 5 to approximately 30 nm is particularly advantageous.

The laser power is, in this respect, preferably selected such that the plasma is generated in a film plane having an expansion corresponding approximately to the focus.

The focus is preferably selected in the film plane such that its diameter is less than a dimension of the structured layer to be applied in a plane parallel to the film plane. This has the great advantage that the structured layer can be produced with a very high degree of precision since its dimensions are produced by multiple, side-by-side application of material from the focus region to the process substrate.

Moreover, it is advantageous for the structured layer to be produced by superposed application of material from the focus region of the material film to the process substrate. This offers the possibility of applying considerably thicker layers to the process substrate despite the very thin material film.

No details have so far been given with respect to the laser used. It is, for example, particularly advantageous for the laser beam to be composed of a plurality of laser pulses following one another in timed sequence. These laser pulses preferably follow one another at a repetition rate in the region of approximately 10 kHz.

A mode of operation for the process has proven to be particularly expedient, in which with each laser pulse a transfer of a focus region of the material film onto the process substrate is carried out so that a renewed positioning of the focus takes place on the material film from laser pulse to laser pulse.

In this respect, it is particularly favourable, with regard to a layer application which is as effective as possible, for the focus regions of successive laser pulses to be positioned on the material film so as not to overlap and so a full-surface application of material from the material film occurs with each laser pulse in the focus region.

It is particularly advantageous, especially in order to exploit the material film in an optimum manner, for the focus regions of successive laser pulses to be positioned on the material film so as to be adjacent one another.

Within the scope of the explanations concerning the above embodiments no details have so far been given as to how a structured layer can be advantageously built up. It is, for example, particularly advantageous for the focus to be moved relative to the material film from laser pulse to laser pulse and for the material film to be moved relative to the process substrate after a predetermined number of laser pulses. This means that either the material film can be moved while the process substrate is stationary or the process substrate can be moved relative to the material film.

In particular when the material film is very thin, this would mean that, first of all, at least one partial area of the structured layer is applied in the form of a thin part layer having the desired dimension and then a relative movement takes place between material film and process substrate in order to apply a further thin part layer thereto.

In this respect, it is particularly advantageous for the material film to be arranged at a distance from the surface region of the process substrate which is less than ten times a diameter of the focus.

In order, in addition, to obtain an imaging or focusing quality which is as good as possible, the distance of the material film from the surface of the process substrate is less than 100 μm. The material film is preferably arranged at a distance of less than 10 μm from the surface of the process substrate. It is even more advantageous for the distance to be even less and, for example, in an extreme case for the material film to rest essentially on the surface of the process substrate.

Especially when using a transparent carrier as carrier for the material film, it has proven advantageous for an optical focusing means for the laser beam to be arranged on a side of the transparent carrier remote from the material film.

It is particularly favourable for the optical focusing means to be coupled to the transparent carrier by means of an immersion fluid so that the possibility is given of focusing onto a focus, the dimension of which can be smaller than the wavelength of the laser beam. This embodiment offers, in particular, the advantage of producing very fine and precisely structured layers.

Alternatively to providing a transparent plate, to which the optical focusing means is coupled by means of an immersion fluid, it is advantageous for the optical focusing means to be arranged on the carrier in optical contact and in a reflection-free manner, i.e. the optical focusing means and the carrier form a unit so that the immersion fluid can be omitted.

This is possible, in particular, when the optical focusing means is integrally connected to the carrier.

With such a design of optical focusing means and carrier the inventive process can preferably be carried out in that prior to an application of material from the material film to the process substrate the material film itself is applied to the carrier by means of the laser used for the application of the structured layer. The great advantage of this solution is therefore to be seen in the fact that the laser beam used for the application of the structured layer can be used at the same time to apply the material film itself to the carrier whereas the embodiments of the inventive solution described so far did not specify how the material film is to be applied to the carrier. In the embodiments described thus far, this is conceivable by way of a customary vapor-deposition process or even a laser coating process.

In the embodiment described in the above, it is particularly advantageous for the laser beam to irradiate the carrier for applying the material thereto, i.e. the arrangement of carrier and laser beam relative to one another which is used is the same as for the application of the structured layer to the process substrate.

In this respect, the carrier is preferably arranged at a distance from a surface of a material target for the application of the material film so that when the carrier is irradiated by the laser beam the laser beam strikes the surface of the material target.

The distance is preferably selected such that it is more than 1 mm, in particular a few millimeters.

With a particularly advantageous coating of the carrier, the material of the material target is heated on its surface by the laser beam, expands in the direction of the carrier and is deposited on the carrier in a deposition region. With this inventive solution, it is, therefore, not the entire carrier which is provided with the material film but only the deposition region.

Such a coating of the carrier may be achieved particularly advantageously when the laser beam is focused onto a surface of the material target during the application of the material film.

With this inventive solution, and following the coating of the carrier with the material film, the structured layer is applied in the same manner as in the aforementioned process with carrier, i.e. the laser beam is again focused after the material film is applied to the carrier such that one focus thereof is preferably located approximately in the plane of the material film or on the surface of the material film facing the laser beam.

Since, in the embodiments of the inventive process described in the above, carrier and optical focusing means form one unit, relative movement of the carrier for the purpose of focusing is no longer possible. In order, nevertheless, to be able to use the entire material of the material film in the deposition region for the application of the structured layer, it is advantageous for the focus of the laser beam to be moved relative to the carrier for the structured application of the material from the material film to the substrate.

This may be achieved particularly advantageously when the focus is moved by movement of the laser beam relative to the carrier and to the optical focusing means, whereby the carrier and the optical focusing means, in particular, form a mutually displaceable unit.

With respect to the composition of the material film, no precise details have so far been given. It is, for example, particularly favourable for the material film to have a material composition functionally ready for the structured layer of the functional structure. This means that following the application of the structured layer with the material film the functionally ready layer is on hand and, for example, no subsequent doping thereof need take place.

So far, no details have been given with respect to the ambient conditions for performing the inventive process. In a particularly advantageous embodiment of the inventive process, the application of the structured layer is performed under high vacuum or ultra-high vacuum since, in this way in particular, the required quality of the semiconductor components can be achieved in a simple manner and, moreover, the great advantages of the inventive solution as regards soiling take full effect.

Furthermore, the invention relates to an apparatus for applying structured layers of a functional structure of a semiconductor component which is characterized in that this comprises a material film which can be positioned above a surface region of a process substrate to be provided with the structured layer, that the material film is acted upon on its side remote from the process substrate by a focus of a laser beam of a laser located in a defined position corresponding to the structured layer to be produced and that the material in the material film can be heated with the laser beam in the region of the focus and material from the material film can thereby be transferred from the focus region onto the surface region.

The advantage of the inventive solution is, in the same manner as in the inventive process, to be seen in the fact that a structured layer can hereby be applied in a simple and defined manner to a process substrate.

Additional advantageous embodiments of the inventive apparatus are the subject matter of the additional subclaims 34 to 44 and, moreover, additional advantageous features of the inventive apparatus have already been specified in conjunction with the above explanations of the inventive process. Reference is therefore made in full to the above comments with respect, in particular, to the advantages which can be attained with the additional embodiments.

Additional features and advantages of the invention are the subject matter of the following description as well as the drawings of several embodiments of the inventive solution. In the drawings.

Figure 1:
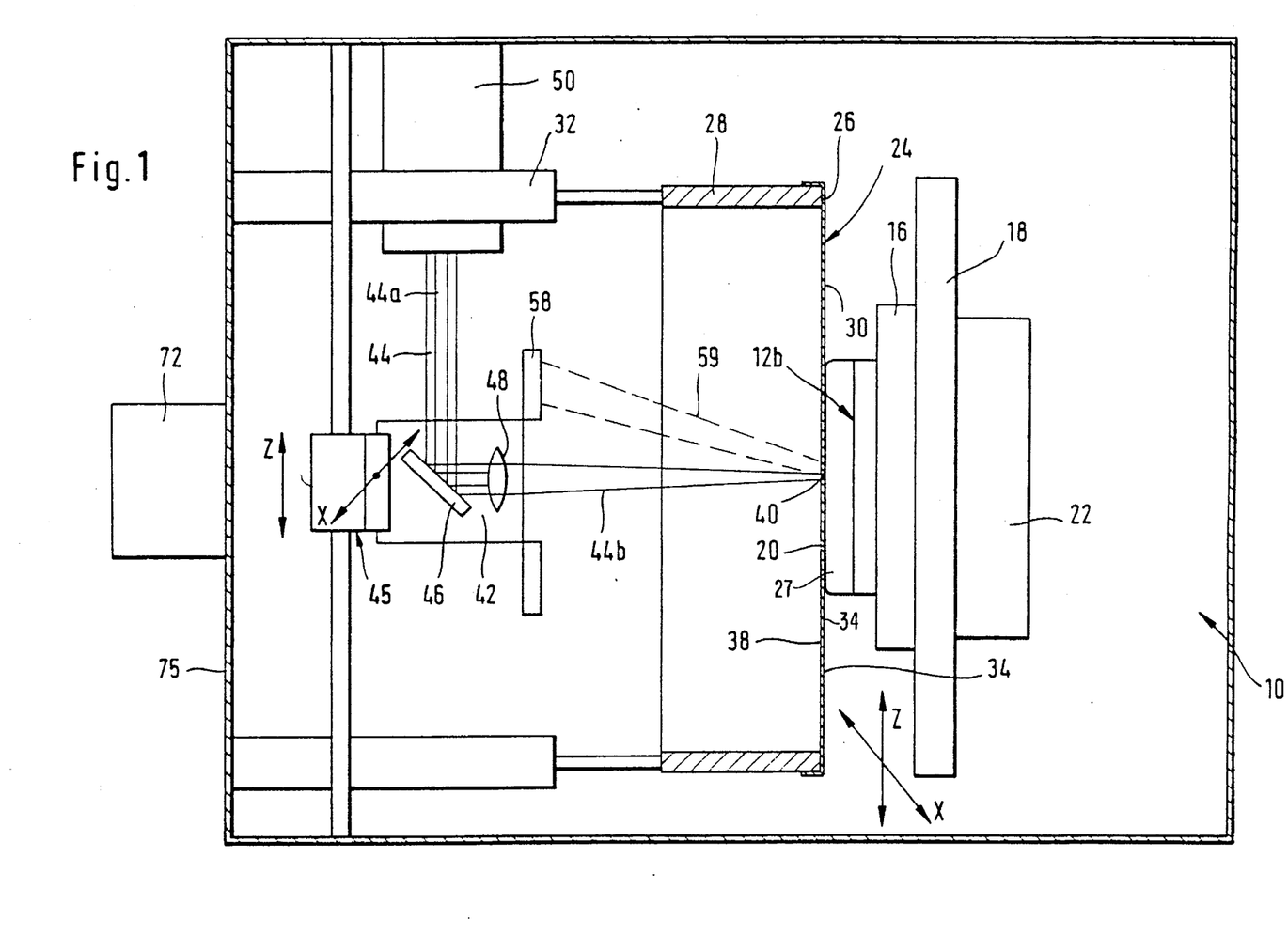
FIG. 1 is an illustration of a first embodiment of an inventive coating station for the application of structured layers.

In one embodiment of an inventive solution, illustrated in FIG. 1, a structuring coating of a process substrate 12b in the form of, for example, individual webs takes place in a coating apparatus 10 for structured layers.

As illustrated in FIG. 1, the process substrate 12b is held with the applied layers on a substrate carrier 16 which, for its part, is displaceable on a base unit 18 in an X and a Z direction, whereby a surface 20 of the functional structure 27 extends parallel to the XZ plane.

The base unit 18 has, for this purpose, a drive 22, with which the process substrate 12b, together with its functional structure, can be positioned exactly in the XZ plane.

A metal foil 24 forming a material film can be placed on the surface 20 and the material of this foil is intended to be metallizable onto the surface 20 in a structured manner, i.e., for example, in strips or in a meandering shape.

The metallization hereby represents one embodiment for the application of structured layers. In the same way, the embodiments described can also serve to apply structured semiconductor layers, whereby the material film then comprises semiconductor material with the respectively desired composition and doping.

This metal foil 24 preferably has a thickness of less than 5 micrometers.

In addition, this foil 24 is fixed in position, for example, at an outer edge 26 of a retainer ring 28 and with a free region 30 is tensioned without support within the outer edge 26 extending all around it. This free region can be placed onto the surface 20. In addition, the retainer ring 28 can be moved towards or away from the surface 20 by an adjusting means 32 so that after positioning of the process substrate 12b the entire foil 24 can be positioned, due to movement of the retainer ring 28 by the adjusting means 32 towards the surface 20, at a distance of, for example, a few μm from the surface 20 or be placed directly on this surface with its front side 34.

Figure 2:
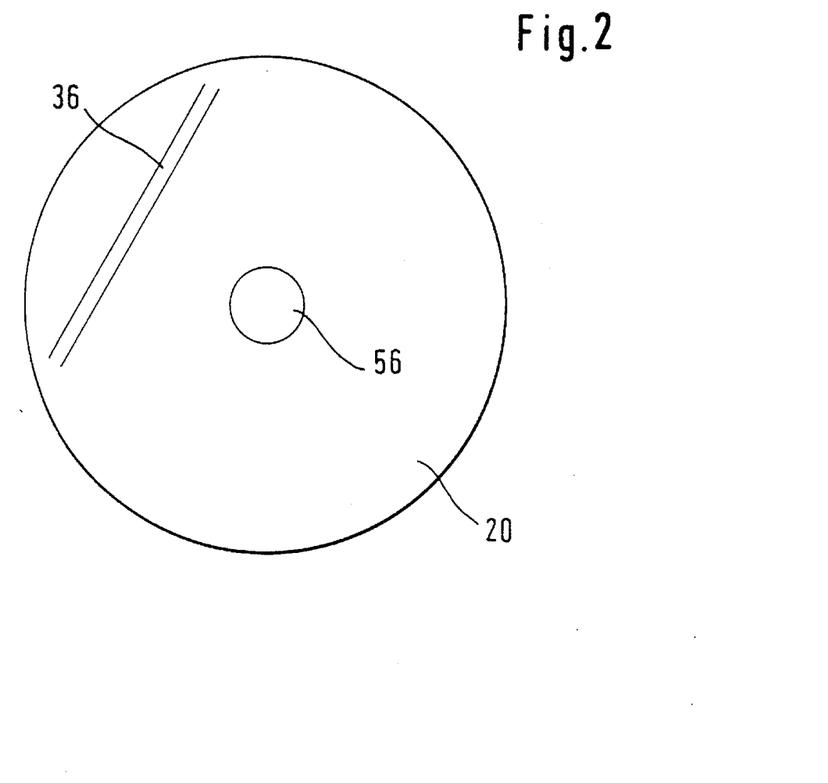
FIG. 2 is a schematic illustration of a structured layer.

If the foil 24 is positioned with its front side 34 relative to the surface 20 of the functional structure 27 as illustrated, a strip 36 illustrated in FIG. 2 is, for example, metallized onto the surface 20 by irradiation of a rear side 38 of the foil 24 by means of the laser beam 44. In this respect, the laser beam 44 is focused with a section 44b onto a focus 40 on the rear side 38 of the foil 24. For this purpose, an optical imaging means 42 is provided which, for its part, is also positionable in an XZ plane by means of a double carriage system 45. This optical imaging means 42 comprises a deflecting mirror 46 for a section 44a of the laser beam 44 incoming parallel to the XY plane as well as a lens 48 arranged after the mirror which focuses the section 44b of the laser beam 44 onto the focus 40. The laser beam 44 is preferably generated by a schematically illustrated laser 50.

The surface 20 is now metallized in that a plasma is generated in the focus 40 from the material of the foil 24, the plasma particles of which move, on the one hand, along the arrows 52 in the direction towards the optical imaging means 42 (FIG. 3), these preferably being particles from the material of the foil 24 located on the rear side 38.

Figure 3:
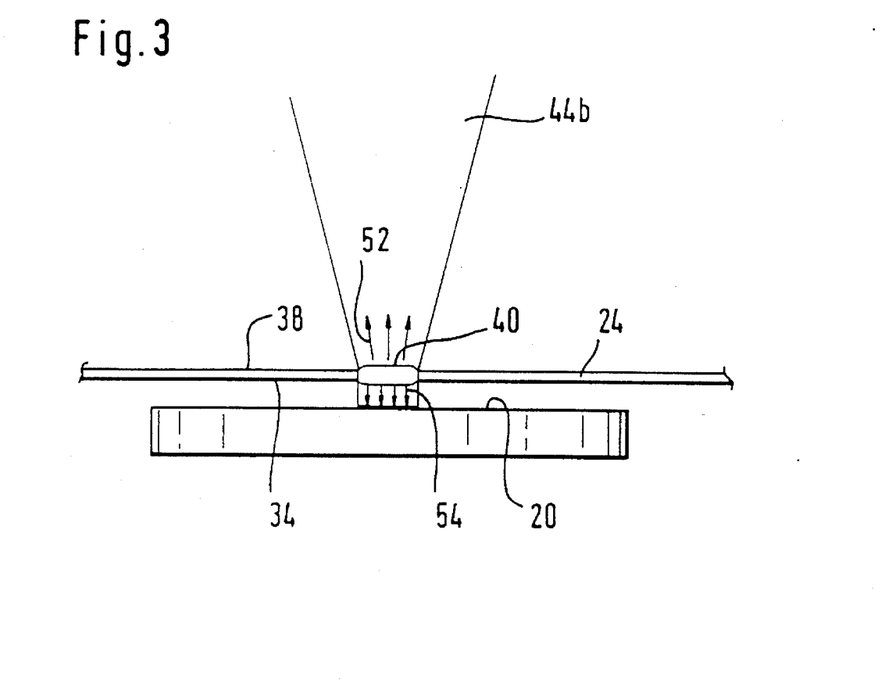
FIG. 3 is an enlarged illustration of a detail, showing relations in the region of a focus in FIG. 1.

This automatically leads to material or particles located on the front side 34 of the foil 24 being accelerated in the direction of arrows 54 by a pressure surge resulting during the plasma generation, thereby striking the surface 20 of the process substrate and being fixed in position on this surface.

As a result of movement of the focus 40 relative to the foil 24, optional strips 36 or even round metallized areas 56 can be produced on the surface 20, whereby it is also possible to produce more complicated structures, for example complicated path conductor structures, on the surface 20.

Figure 4:
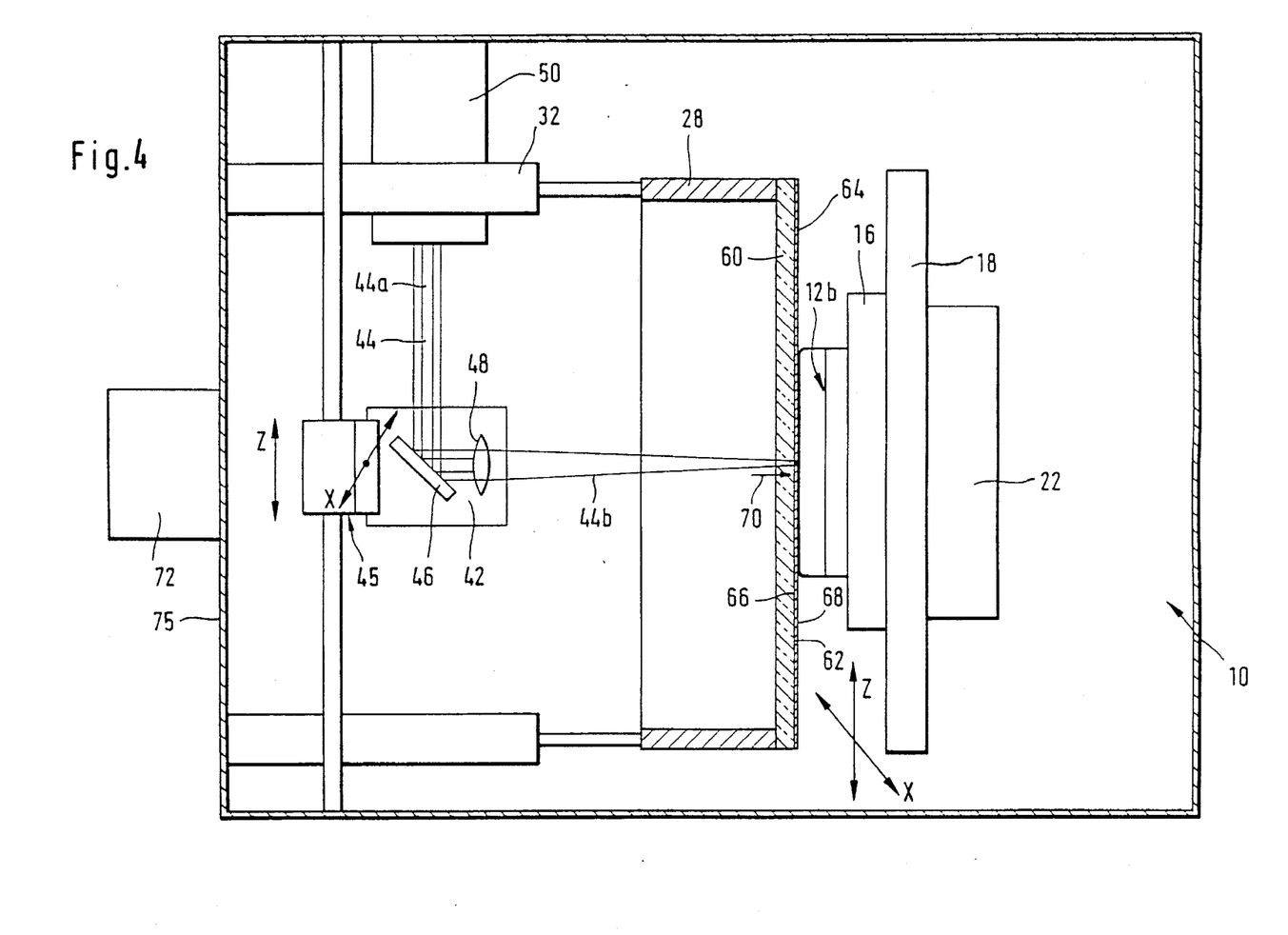
FIG. 4 is an illustration of a second embodiment for the application of a structured layer.

In a second embodiment of the inventive coating apparatus 10, illustrated in FIG. 4, the foil 24 is replaced by a transparent plate 60, to the front side 62 of which, i.e. the side facing the surface 20, a metal film 64 is applied, i.e., for example, vapor-deposited, as material film. This film has a thickness in the order of an absorption depth of the laser radiation in this metal film 64. This thickness is, in particular, less than 0.1 μm, preferably 30 nm or less.

The transparent plate 60 is supported by the retainer ring 28 in the same way and movable by the adjusting means 32 in the same way as the foil 24 relative to the surface 20. The laser beam 44b is thereby focused onto a rear side 66 of the metal film 64, i.e. the side resting on the transparent plate 60, and when striking this side generates a plasma from the material of the metal film 64 so that parts of the material of the metal film 64, in particular on a front side 68 thereof, are accelerated onto the surface 20 in the direction of the arrow 70, strike this surface and are thereby fixed in position.

The advantage of this embodiment is to be seen in the fact that this allows the metal film to be thinner than the foil 24, for example so thin that the plasma extends through the thickness of the metal film 64 so that particles from the plasma are deposited on the surface 20 and form a part layer which is in the range of a few nm so that several part layers are to be placed on top of one another to build up a greater layer thickness.

Furthermore, especially for the application of thicker metallizations, several metallizing layers are applied on top of one another, i.e., for example, a first part layer is applied, then the transparent plate 60 with the metal film 64 displaced to such an extent that a second and, where necessary, a third part layer can be applied.

In order to utilize the entire surface of the foil 24 or the metal film 64 for the metallization, the laser beam 44b is displaceable due to displacement of the optical imaging means 42 essentially over the entire inner region of the retainer ring 28. Furthermore, the process substrate 12b with the functional structure 27 is also displaceable so that successive increasing areas of the foil 24 or of the metal film 64 can be used for metallizing the surface 20. This leads to a utilization of the free region 30 of the foil 24 or the metal film 64 which is as effective as possible.

For this purpose, a control 72 is provided which controls both the movement of the laser beam 44b and the relative movement of the substrate 12b with the functional structure 27 and, in particular, memorizes which areas of the foil 24 or the metal film 64 have already been ablated by plasma generation and are, therefore, no longer available for the further structured metallization. This means that use of the material of the foil 24 or of the metal film 64 is as effective as possible.

Figure 5:
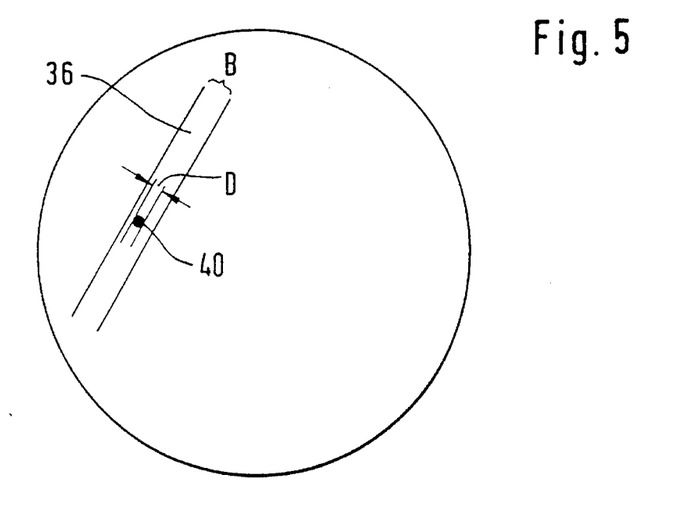
FIG. 5 is a schematic illustration of the structured layer during application in accordance with the second embodiment according to FIG. 4.

As illustrated in FIG. 5, the focus preferably has a diameter D which is smaller than a width B of a structure to be metallized, for example of the strip 36, so that the structure to be applied results from repeated application of the metallization and each time with the diameter D of the focus 40.

Figure 6:
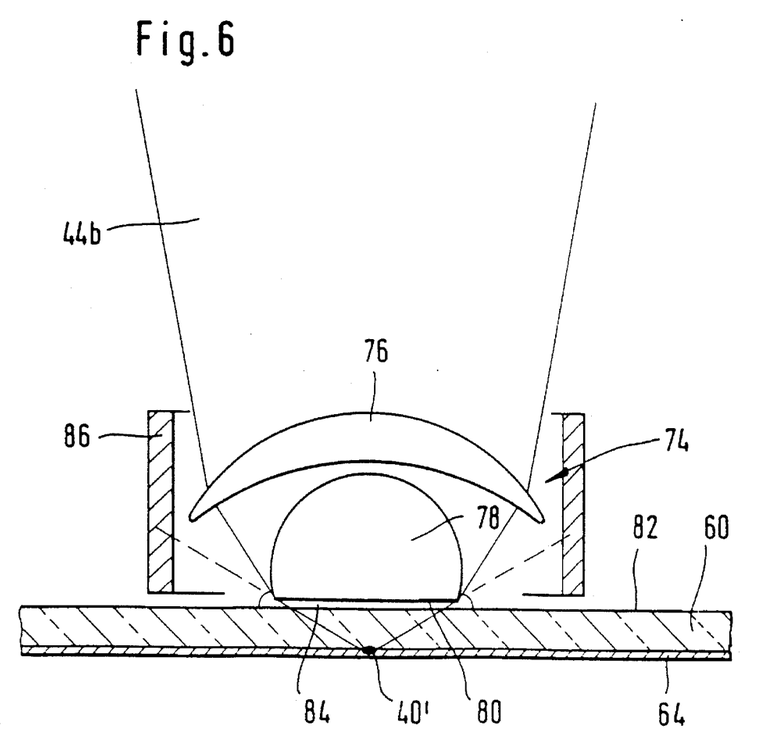
FIG. 6 is an enlarged illustration of a detail in the region of the focus in a first variation of the second embodiment according to FIG. 4.

In a variation of the second embodiment, illustrated in FIG. 6, an additional focusing element 74 is arranged on the transparent plate 60. This additional focusing element comprises a first focusing lens 76 and a second focusing lens 78, whereby the second focusing lens rests with a flat underside 80 on a rear side 82 of the transparent plate 60 remote from the metal film 64 and an immersion fluid 84 is arranged between the underside 80 and the rear side 82. The first lens 76 already bundles the laser beam 44b and images this onto the second lens 78. Due to the fact that the laser beam, following the second lens, always extends into material having a refraction index greater than 1, an additional focusing takes place onto a focus 40' and this can be smaller than the wavelength of the laser beam. This means that particularly small structures can be produced.

The focusing element 74 is, for its part, held in a housing 86 and also moved with the laser beam 44b, i.e. with the carriage system 45, whereby the second lens 78 floats, so-to-speak, on the immersion fluid 84 when the laser beam 44b moves relative to the transparent plate 60.

Figure 7:
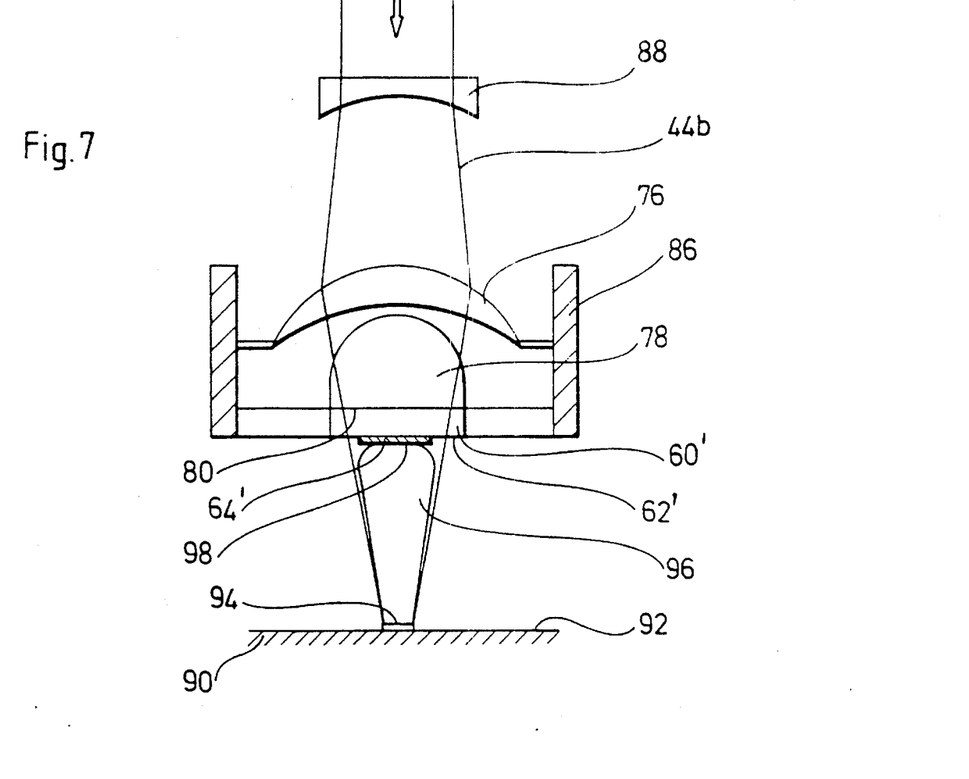
FIG. 7 is an illustration similar to FIG. 6 of a second variation of the second embodiment during production of the material film and FIG. 8 is an illustration of the second variation during production of a structured layer.
Figure 8:
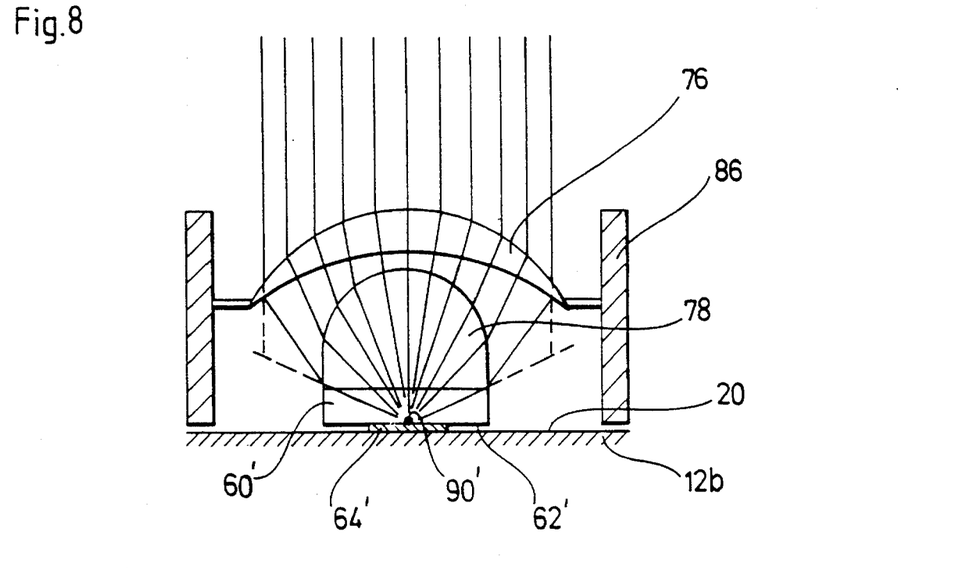

In a second variation of the second embodiment, illustrated in FIGS. 7 and 8, the focusing element 74 which is used in the first variation is used again here. In contrast to the first variation, the second lens 78 of the focusing element is seated directly on and in optical contact, i.e. reflection-free, with the carrier 60' which, in this second variation, is preferably merely of a size which corresponds to a diameter of the underside 80 of the second lens 78.

In contrast to the first variation, in which the basis is a carrier 60 coated with the metal film 64, whereby no details whatsoever have been given concerning the application of the metal film 64 to the carrier 60 and which can therefore take place as required, for example by conventional vapor-deposition, in the second variation as illustrated in FIG. 7 the metal film 64 is applied to the carrier by means of the laser beam used for the application of the structured layer.

For this purpose, the laser beam 44b, as illustrated in FIG. 7, is expanded by insertion of an expansion lens 88 in such a manner that it is essentially focused onto an irradiation spot 94 of a material target 90 when the carrier 60' is positioned with its front side 62' at a distance of a few millimeters from a surface 92 of the material target.

In the irradiation spot 94 the material of the material target is therefore heated, preferably to form a plasma, which expands in the form of a cone 96 in the direction of the carrier 60' and is deposited as metal film 64' on the front side 62', namely in a deposition region 98 determined by a cross section of the cone 96.

Following the coating of the front side 62' of the carrier 60' in the deposition region 98, the carrier 60', as illustrated in FIG. 8, is moved over the process substrate 12b and positioned in the manner already described above at a distance from the surface of the process substrate 12b.

Furthermore, the expansion lens 88 is withdrawn so that the laser beam 44b—as already described in conjunction with the first variation—is now fixed onto the focus 40' which lies approximately in the plane of the material film 64'.

This means that it is possible to apply a structured layer to the surface 20 of the process substrate by means of the laser beam 44b focused in the same manner as in the first variation by generating a plasma. This application has already been described in detail in conjunction with the second embodiment and its first variation and so reference is made in full to the subject matter thereof.

Furthermore, in order to remove the metal film 64' in the entire deposition region 98, the focus 40' is moved within the deposition region 98 due to displacement of the laser beam 44b relative to the carrier 60' and the entire focusing element 74. Thus, the entire deposition region 98 can be utilized for the application of parts of a structured layer on the surface 20 of the process substrate 12b and the metal film 64' is not applied again in the manner described in conjunction with FIG. 7 until the entire deposition region 98 has been removed.

This means that with the single application of a metal film 64' in the deposition region 98 a multiple structured application of layers to the surface 20 of the process substrate 12b is possible before a renewed application of the metal film 64' in the deposition area 98 must take place.

As laser, a laser having a pulse duration of 1 to 100 picoseconds can also be used, whereby the wavelength is between approximately 0.2 and 1.2 μm and the light density is greater than $10^8$ w/cm$^2$, preferably around $10^9$ but no more than $10^{10}$ w/cm$^2$ in the region of the focus 40 in the second embodiment and in the first embodiment preferably more than $10^{10}$ w/cm$^2$.

The metallization is preferably carried out in all the embodiments in a high vacuum so that the entire arrangement described in the above is arranged in a housing 75 which is accessible via lock means.

In this case, measures must be taken in the first embodiment to prevent any soiling of the optical imaging means 42 by the foil 24. For example, the optical imaging means 42 is provided with a particle intercepting shield 58 extending around the laser beam 44b. An electrical field 59 is formed between this shield and the foil 24 and the particles move along this electrical field when a plasma is generated so that any soiling, in particular, of the lens 48 is avoided.

Alternatively, it is conceivable to provide a flow of protective gas penetrating the laser beam 44b.

These measures are superfluous in the second embodiment described in FIG. 4 since a protection of the optical imaging means 42 is already ensured by the transparent plate.

A suitable laser system is, for example, a conventional system generating picosecond pulses with the specified power. A laser system, which is known from German patent 40 22 817, is preferably used.

What is claimed is:

1. A process for applying structured layers of a functional structure of a semiconductor component, comprising the steps of:

arranging a material film above a surface region of a process substrate to be provided with the structured layer;

acting upon the material film on its side remote from the process substrate by a focus of a laser beam located in a defined position corresponding to the structured layer to be produced;

heating the material in the material film with the laser beam in the region of the focus so that material from the material film migrates from the focus region to the surface region; and producing the structured layer by overlapping application of material from the focus region of the material film to the process substrate.

2. A process as defined in claim 1, wherein the material film is arranged on a carrier permeable to the laser beam.

3. A process as defined in claim 2, wherein said carrier is a rigid element.

4. A process as defined in claim 2, wherein said laser beam generates a plasma that penetrates a thickness of the material film.

5. A process as defined in claim 4, wherein the plasma is generated in a film plane with an expansion corresponding approximately to a shape of the laser beam as it converges toward said focus.

6. A process as defined in claim 1, wherein the material film is arranged on a transparent carrier permeable to the laser beam and an optical focusing means for the laser beam is arranged on a side of the transparent carrier remote from the material film.

7. A process as defined in claim 6, wherein prior to an application of material from the material film to the process substrate, the material film itself is applied to the carrier by means of the laser used for applying the structured layer.

8. A process as defined in claim 7, wherein the laser beam irradiates the carrier for applying the material thereto.

9. A process as defined in claim 7, wherein the carrier is arranged at a distance from a surface of a material target for applying the material film.

10. A process as defined in claim 9, wherein said distance is in a range of from about 1 to 5 millimeters.

11. A process as defined in claim 9, wherein the material of the material target is heated on its surface, expands in the direction of the carrier and is deposited on the carrier.

12. A process as defined in claim 9, wherein the laser beam is focused onto a surface of the material target.

13. A process as defined in claim 6, wherein the focus of the laser beam is moved relative to the carrier for the structured application of the material from the material film onto the substrate.

14. A process as defined in claim 13, wherein the focus is moved by movement of the laser beam relative to the carrier and to the optical focusing means.

15. A process as defined in claim 1, wherein the focus is selected in the film plane such that its diameter is less than a dimension of the structured layer to be applied in a plane parallel to the film plane.

16. A process as defined in claim 1, wherein the laser beam consists of a plurality of laser pulses following one another in a timed sequence.

17. A process as defined in claim 16, wherein with each laser pulse, a transfer of material occurs from a focus region of the material film onto the process substrate.

18. A process as defined in claim 16, wherein the focus regions of successive laser pulses are positioned on the material film so as not to overlap.

19. A process as defined in claim 16, wherein the focus regions of successive laser pulses are positioned on the material film so as to be adjacent one another.

20. A process as defined in claim 16, wherein the focus from laser pulse to laser pulse is moved relative to the material film.

21. A process as defined in claim 1, wherein the material film is moved relative to the process substrate.

22. A process as defined in claim 1, wherein the material film is arranged at a distance from the surface region of the process substrate, said distance being less than ten times a diameter of the focus.

23. A process as defined in claim 1, wherein the material film has a material composition functionally ready for the structured layer of the functional structure.

24. A process as defined in claim 1, wherein the application of the structured layer is performed under high vacuum or ultra-high vacuum.

25. A process for applying structured layers of a functional structure of a semiconductor component, comprising the steps of:

arranging a material film above a surface region of a process substrate to be provided with the structured layer;

generating a laser pulse having a duration of between about 1 and 100 picoseconds, a focus of said laser pulse, located in a defined position corresponding to the structured layer to be produced, acting upon the material film on its side remote from the process substrate; and heating the material in the material film with the laser pulse in the region of the focus with a light density greater than $10^8 w/cm^2$ so that material from the material film migrates from the focus region to the surface region;

wherein the structured layer is produced on the process substrate by overlapping application of material from the focus region of the material film.

26. A process as defined in claim 25, wherein the focus is selected in the film plane such that its diameter is less than a dimension of the structured layer to be applied in a plane parallel to the film plane.

27. A process as defined in claim 25, wherein the structured layer is produced by multiple applications of structured part layers.

28. A process as defined in claim 25, wherein each structured part layer is produced by a side-by-side application of material from the focus regions.

29. A process as defined in claim 25, wherein the laser beam consists of a plurality of laser pulses following one another in a timed sequence.

30. A process as defined in claim 29, wherein with each laser pulse, a transfer of material occurs from a focus region of the material film onto the process substrate.

31. A process as defined in claim 29, wherein the focus regions of successive laser pulses are positioned on the material film so as to be adjacent one another.

32. A process as defined in claim 29, wherein the focus from laser pulse to laser pulse is moved relative to the material film.

33. A process as defined in claim 25, wherein the material film is moved relative to the process substrate.

34. A process as defined in claim 25, wherein the material film is arranged at a distance from the surface region of the process substrate, said distance being less than ten times a diameter of the focus.

35. A process as defined in claim 25, wherein the material film has a material composition functionally ready for the structured layer of the functional structure.

36. A process as defined in claim 25, wherein the application of the structured layer is performed under high vacuum or ultra-high vacuum.

37. A process as defined in claim 25, wherein the material film is arranged on a carrier permeable to the laser beam.

38. A process for applying structured layers of a functional structure of a semiconductor component, comprising the steps of:

arranging a material film above a surface region of a process substrate to be provided with the structured layer;

generating a laser pulse having a duration of between about 1 and 100 picoseconds, a focus of said laser pulse, located in a defined position corresponding to the structured layer to be produced, acting upon the material film on its side remote from the process substrate; and heating the material in the material film with the laser pulse in the region of the focus with a light density greater than $10^8 w/cm^2$ so that material from the material film migrates from the focus region to the surface region;

wherein the laser beam consists of a plurality of laser pulses following one another in a timed sequence and the focus regions of successive laser pulses are positioned on the material film so as not to overlap.

39. A process for applying structured layers of a functional structure of a semiconductor component, comprising the steps of:

arranging a material film above a surface region of a process substrate to be provided with the structured layer;

generating a laser pulse having a duration of between about 1 and 100 picoseconds, a focus of said laser pulse, located in a defined position corresponding to the structured layer to be produced, acting upon the material film on its side remote from the process substrate; and heating the material in the material film with with the laser pulse in the region of the focus with a light density greater than $10^8 w/cm^2$ so that material from the material film migrates from the focus region to the surface region;

wherein the material film is arranged on a transparent carrier permeable to the laser beam, an optical focusing means for the laser beam is arranged on a side of the transparent carrier remote from the material film, and the optical focusing means is coupled to the transparent carrier by means of an immersion fluid.

40. A process for applying structured layers of a functional structure of a semiconductor component, comprising the steps of:

arranging a material film above a surface region of a process substrate to be provided with the structured layer;

generating a laser pulse having a duration of between about 1 and 100 picoseconds, a focus of said laser pulse, located in a defined position corresponding to the structured layer to be produced, acting upon the material film on its side remote from the process substrate; and heating the material in the material film with the laser pulse in the region of the focus with a light density greater than $10^8 w/cm^2$ so that material from the material film migrates from the focus region to the surface region;

wherein the material film is arranged on a transparent carrier permeable to the laser beam, an optical focusing means for the laser beam is arranged on a side of the transparent carrier remote from the material film, and the optical focusing means is arranged to focus the laser pulse on the carrier in a reflection-free manner.

41. A process as defined in claim 40, wherein the optical focusing means is integrally connected to the carrier.

42. A process for applying structured layers of a functional structure of a semiconductor component, comprising the steps of:

arranging a material film above a surface region of a process substrate to be provided with the structured layer;

acting upon the material film on its side remote from the process substrate by a focus of a laser beam, said laser beam consisting of a plurality of successive laser pulses following one another in timed sequence;

locating the focus regions of said successive laser pulses on the material film so as not to overlap; and heating the material in the material film with the laser beam in the focus regions so that material from the material film migrates from the focus regions to the surface region.

43. A process for applying structured layers of a functional structure of a semiconductor component, comprising the steps of:

arranging a material film on a carrier transparent to the laser beam and above a surface region of a process substrate to be provided with the structured layer;

arranging an optical focusing means for a laser beam on a side of the transparent carrier remote from the material film, said optical focusing means and said transparent carrier being coupled by means of an immersion fluid;

acting upon the material film on its side remote from the process substrate by a focus of said laser beam located in a defined position corresponding to the structured layer to be produced; and heating the material in the material film with the laser beam in the region of the focus so that material from the material film migrates from the focus region to the surface region.

44. A process for applying structured layers of a functional structure of a semiconductor component, comprising the steps of:

arranging a material film on a carrier transparent to the laser beam and above a surface region of a process substrate to be provided with the structured layer;

arranging an optical focusing means for a laser beam on a side of the transparent carrier remote from the material film, said optical focusing means being arranged to focus the laser beam on the carrier in a reflection-free manner;

acting upon the material film on its side remote from the process substrate by a focus of said laser beam located in a defined position corresponding to the structured layer to be produced; and heating the material in the material film with the laser beam in the region of the focus so that material from the material film thereby migrates from the focus region to the surface region.

* * * * *